United States Patent
Sakabe

(10) Patent No.: US 6,727,575 B2
(45) Date of Patent: Apr. 27, 2004

(54) SEMICONDUCTOR DEVICE

(75) Inventor: Katsumi Sakabe, Kawanishi (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/953,294

(22) Filed: Sep. 17, 2001

(65) Prior Publication Data

US 2002/0149094 A1 Oct. 17, 2002

(30) Foreign Application Priority Data

Apr. 12, 2001 (JP) ........................ 2001-114062

(51) Int. Cl.[7] .................. H01L 23/495; H01L 23/22; H01L 23/24; H01L 23/48; H01L 23/52; H01L 23/28; H01L 23/29
(52) U.S. Cl. .................. 257/667; 257/666; 257/676; 257/687; 257/690; 257/692; 257/787; 257/789
(58) Field of Search ................... 257/666, 667, 257/676, 687, 690, 692, 787, 789

(56) References Cited

U.S. PATENT DOCUMENTS 6,313,520 B1 * 11/2001 Yoshida et al. ............. 257/676

2002/0149091 A1 * 10/2002 Palmteer et al. ........... 257/667

FOREIGN PATENT DOCUMENTS

| JP | 57-45960 | 3/1982 | |
| JP | 403217030 A | * 9/1991 | .......... H01L/21/56 |
| JP | 4-242966 | 8/1992 | |

* cited by examiner

Primary Examiner—Nathan J. Flynn
Assistant Examiner—Victor A. Mandala, Jr.
(74) Attorney, Agent, or Firm—Oblon, Spivak, McClelland, Maier & Neustadt, P.C.

(57) ABSTRACT

The semiconductor device comprises a lead frame including a die pad portion for mounting a semiconductor element thereon and a board mounting portion for mounting a circuit board thereon, and a sealing resin for sealing the semiconductor element, the circuit board, the die pad portion and the board mounting portion. The lead frame further includes an anchoring region having a higher anchoring effect for the resin than that of each of the die pad portion and the board mounting portion between at least the die pad portion and the board mounting portion. The anchoring region enhances the adhesion of a sealing resin to a lead frame, to prevent the crack of a semiconductor device to be mounted on the lead frame and the disconnection of a bonding wire.

17 Claims, 17 Drawing Sheets

F I G . 1 7
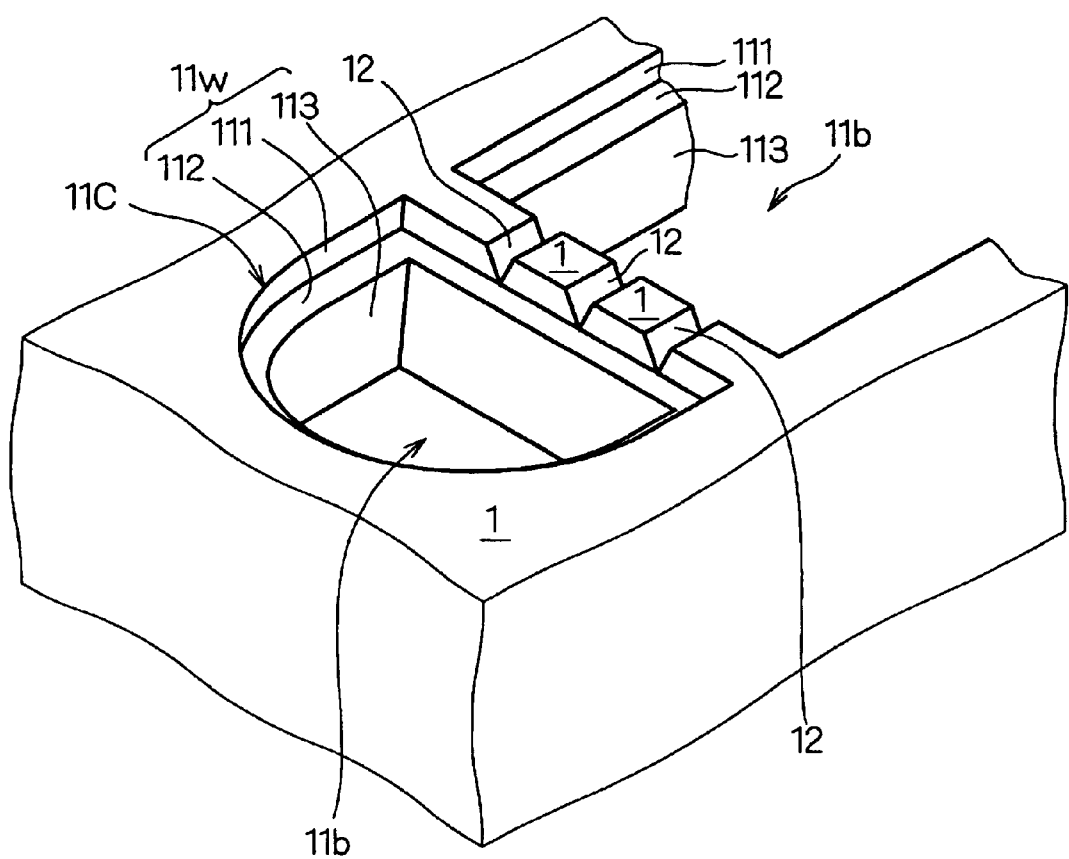

SEMICONDUCTOR DEVICE

BACKGROUND OF THE INVENTION

1. Field of the Invention

The present invention relates to a semiconductor device in which a lead frame having a die pad portion for mounting a semiconductor element thereon and a board mounting portion for mounting a circuit board thereon is sealed with a resin together with the semiconductor element and the circuit board.

2. Description of the Background Art

FIGS. 18A and 18B illustrate a structure of a conventional semiconductor device and are a longitudinal sectional view and a plan view which show a main part of the semiconductor device, respectively. A circuit board 5 having a circuit component 7 such as an IC mounted thereon through a solder bump 6 and a semiconductor element 3 electrically connected to the circuit board 5 through a bonding wire 8 are mounted adjacently to a surface of a plate-shaped lead frame 1. The circuit board 5 is fixed to the lead frame 1 through a bonding resin 4 and the semiconductor element 3 is fixed through a solder 2. Portions of the lead frame 1 where the semiconductor element 3 and the circuit board 5 are to be mounted are sealed with a sealing resin 9 together with the semiconductor element 3 and the circuit board 5. In FIG. 18B, the sealing resin 9 is shown with portions closer to the semiconductor element 3 and the circuit component 7 than the lead frame 1 omitted.

FIGS. 19A and 19B illustrate a structure of another conventional semiconductor device and are a longitudinal sectional view and a plan view which show a main part of the semiconductor device, respectively. In the semiconductor device, a surface of a circuit board 5 mounting a circuit component 7 thereon is coated with another coat resin 10 in such a stage that the circuit board 5 has not been mounted on the lead frame 1. Other structures are the same as those of the semiconductor device shown in FIGS. 18A and 18B. Also in FIG. 19B, a sealing resin 9 is shown with portions closer to a semiconductor element 3 and the circuit component 7 than the lead frame 1 omitted.

Since the lead frame 1 to be employed for the conventional semiconductor devices shown in FIGS. 18A and 18B and FIGS. 19A and 19B is generally plate-shaped, the anchoring effect of the sealing resin 9 is obtained with difficulty. Therefore, it is impossible to sufficiently suppress the generation of a stress due to a difference in a coefficient of linear expansion between the lead frame 1, the semiconductor element 3, the circuit board 5 and the sealing resin 9. There is a problem in that the stress acts on the semiconductor element 3, resulting in the generation of a crack on the semiconductor element 3 or the disconnection of the bonding wire 8.

Moreover, since the lead frame 1 is flat, the solder 2 and the bonding resin 4 flow out from a portion between the semiconductor element 3 and the lead frame 1 and a portion between the circuit board 5 and the lead frame 1 respectively and easily extend over the lead frame 1. Consequently, a contact area of the sealing resin 9 with the lead frame 1 is reduced. From this viewpoint, the adhesion of the sealing resin 9 to the lead frame 1 is deteriorated.

SUMMARY OF THE INVENTION

A first aspect of the present invention is directed to a semiconductor device comprising a lead frame including a die pad portion for mounting a semiconductor element thereon and a board mounting portion for mounting a circuit board thereon, and a resin for sealing the semiconductor element, the circuit board, the die pad portion and the board mounting portion, wherein the lead frame further includes an anchoring region having a higher anchoring effect for the resin than that of each of the die pad portion and the board mounting portion between at least the die pad portion and the board mounting portion.

A second aspect of the present invention is directed to the semiconductor device according to the first aspect of the present invention, wherein the anchoring region has at least one through hole penetrating through a surface and a back in the lead frame between the die pad portion and the board mounting portion in the lead frame.

A third aspect of the present invention is directed to the semiconductor device according to the second aspect of the present invention, wherein a plurality of through holes are provided.

A fourth aspect of the present invention is directed to the semiconductor device according to the third aspect of the present invention, wherein the through hole is provided around the board mounting portion.

A fifth aspect of the present invention is directed to the semiconductor device according to the second aspect of the present invention, wherein the lead frame is divided by a dividing portion into a first lead frame portion having the die pad portion and a second lead frame portion having the board mounting portion, and the dividing portion functions as the anchoring region.

A sixth aspect of the present invention is directed to the semiconductor device according to the fifth aspect of the present invention, wherein the first lead frame portion surrounds the second lead frame portion in three directions as seen on a plane.

A seventh aspect of the present invention is directed to the semiconductor device according to the first aspect of the present invention, wherein the anchoring region is also present in the vicinity of a side part of the die pad portion in such a direction as to partition the die pad portion and the board mounting portion.

An eighth aspect of the present invention is directed to the semiconductor device according to the seventh aspect of the present invention, wherein the anchoring region has a plurality of through holes penetrating through a surface and a back in the lead frame.

A ninth aspect of the present invention is directed to the semiconductor device according to the first aspect of the present invention, wherein the anchoring region has at least one trench concaved in the lead frame between the die pad portion and the board mounting portion in the lead frame.

A tenth aspect of the present invention is directed to the semiconductor device according to the ninth aspect of the present invention, wherein a plurality of trenches are provided.

An eleventh aspect of the present invention is directed to the semiconductor device according to the ninth aspect of the present invention, wherein the anchoring region has at least one through hole penetrating through a surface and a back in the lead frame.

A twelfth aspect of the present invention is directed to the semiconductor device according to any the second, third, fourth, eighth and eleventh aspects of the present invention, wherein a side surface of the through hole has first and second internal wall surfaces which are perpendicular to the surface of the lead frame and a third internal wall surface which is provided in parallel with the surface of the lead frame and serves to connect the first and second internal wall surfaces.

A thirteenth aspect of the present invention is directed to the semiconductor device according to the fifth aspect of the present invention, wherein a side surface of the dividing portion has first and second internal wall surfaces which are perpendicular to the surface of the lead frame and a third internal wall surface which is provided in parallel with the surface of the lead frame and serves to connect the first and second internal wall surfaces.

In the semiconductor element, for example, the lead frame further has a lead to be exposed from the resin and to function as an external connecting terminal.

In the semiconductor element, for example, the semiconductor element of the die pad portion and the circuit board of the circuit mounting portion are electrically connected to each other through a wire.

According to the first and ninth aspects of the present invention, a continuity of an interface of the lead frame and the sealing resin in a direction from the die pad portion toward the board mounting portion (or an opposite direction thereto) is interrupted in the anchoring region so that a stress to be applied from the sealing resin to the die pad portion is relieved. Accordingly, it is possible to prevent the crack of the semiconductor element or the disconnection of the bonding wire from being caused by the stress. A solder and a bonding resin which serve to fix the semiconductor element and the circuit board to the lead frame can be prevented from flowing out between the die pad portion and the board mounting portion. Consequently, the adhesion of the resin can be enhanced.

According to the second aspect of the present invention, the sealing resin communicates at the anchoring region from both sides of the lead frame between the die pad portion and the board mounting portion in the lead frame. Therefore, the anchoring effect of the sealing resin can be increased.

According to the third aspect of the present invention, it is possible to further increase the anchoring effect in the semiconductor device according to the second aspect of the present invention.

According to the fourth aspect of the present invention, it is possible to further increase the anchoring effect in the semiconductor device according to the third aspect of the present invention.

According to the fifth aspect of the present invention, the die pad portion and the board mounting portion are divided in the lead frame and the dividing portion functions as the anchoring region. Therefore, it is possible to obtain the anchoring effect of the semiconductor device according to the second aspect of the present invention.

According to the sixth aspect of the present invention, the anchoring region is also present in the portion extended in the direction from the board mounting portion toward the die pad portion (or the opposite direction thereto). Therefore, it is possible to further increase the anchoring effect in the semiconductor device according to the fifth aspect of the present invention.

According to the seventh and eighth aspects of the present invention, the anchoring region is present not only between the die pad portion and the board mounting portion but also in the vicinity of the side part of the die pad portion in such a direction as to partition the die pad portion and the board mounting portion. Therefore, it is possible to further increase the anchoring effect in the semiconductor device according to the first aspect of the present invention.

According to the tenth or eleventh aspect of the present invention, it is possible to further increase the anchoring effect in the semiconductor device according to the ninth aspect of the present invention.

According to the twelfth aspect of the present invention, it is possible to further increase the anchoring effect in the semiconductor device according to the second, third, fourth, eighth and eleventh aspects of the present invention.

According to the thirteenth aspect of the present invention, it is possible to further increase the anchoring effect in the semiconductor device according to the fifth aspect of the present invention.

It is an object of the present invention to provide a semiconductor device capable of enhancing the adhesion of a sealing resin to a lead frame, thereby preventing the crack of a semiconductor device to be mounted on the lead frame and the disconnection of a bonding wire.

These and other objects, features, aspects and advantages of the present invention will become more apparent from the following detailed description of the present invention when taken in conjunction with the accompanying drawings.

BRIEF DESCRIPTION OF THE DRAWINGS

FIG. 17 is a perspective view showing a schematic structure of a main part of a semiconductor device according to a variant of the twelfth embodiment of the present invention.

DESCRIPTION OF THE PREFERRED EMBODIMENTS

First Embodiment

Figure 1A:
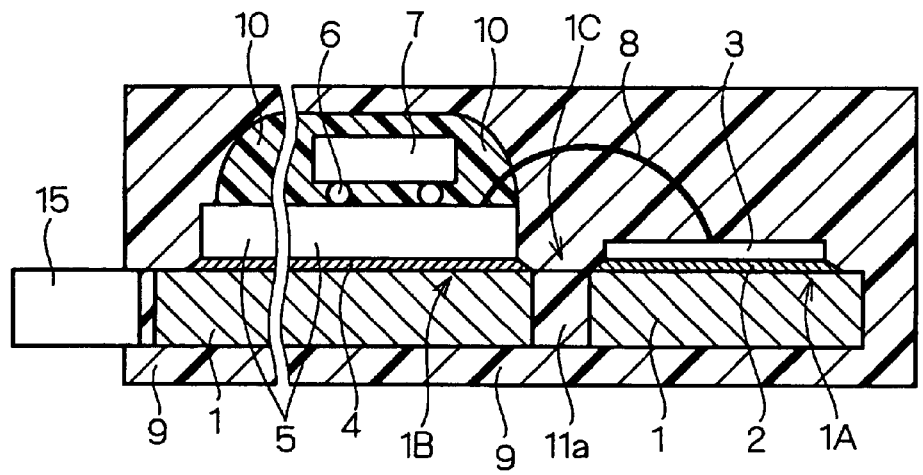
FIGS. 1A and 1B are views showing a schematic structure of a main part of a semiconductor device according to a first embodiment of the present invention.
Figure 1B:
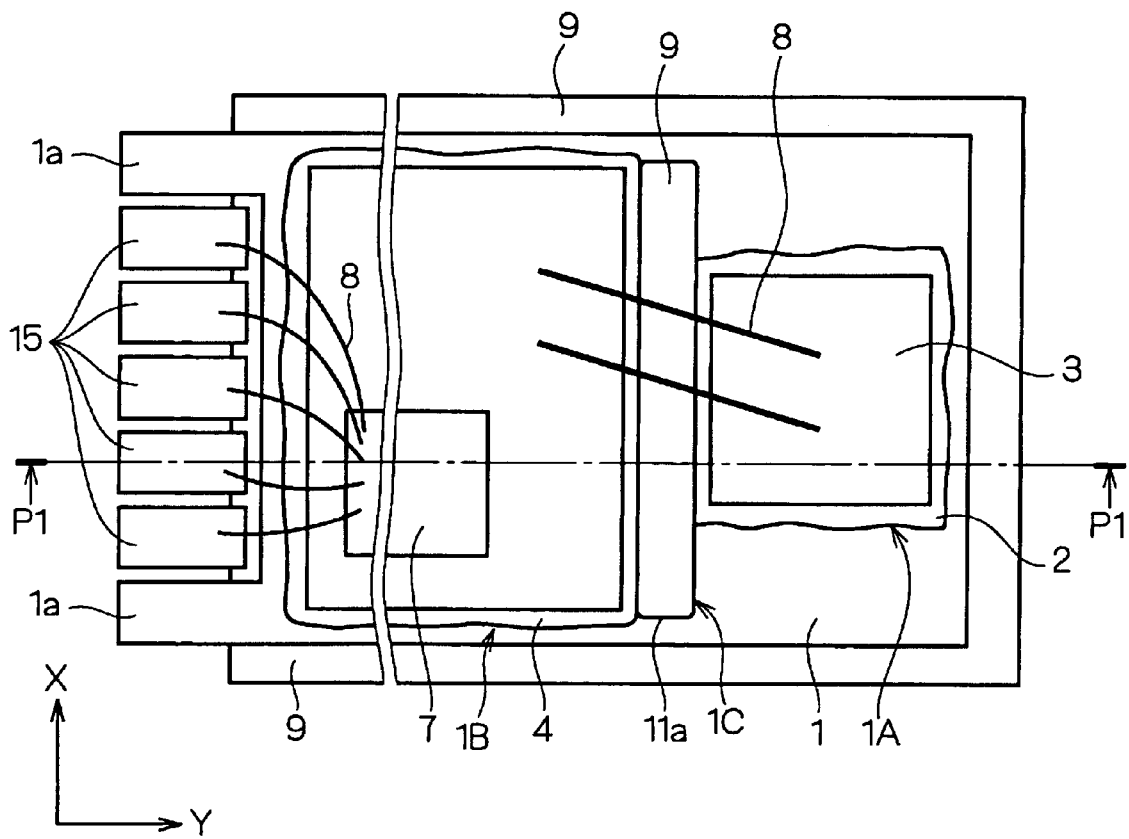

FIGS. 1A and 1B show a schematic structure of a main part of a semiconductor device according to a first embodiment of the present invention and are a longitudinal sectional view and a plan view which show the semiconductor device, respectively.

In the semiconductor device, a lead frame 1 includes a die pad portion 1A for mounting a semiconductor element 3 thereon and a board mounting portion 1B for mounting a circuit board 5 thereon. The lead frame 1, the semiconductor element 3, the circuit board 5, the die pad portion 1A and the board mounting portion 1B are sealed with a sealing resin 9.

The semiconductor element 3 is fixed to a surface of the lead frame 1 through a solder 2. The circuit board 5 is bonded and fixed to the surface of the lead frame 1 through a bonding resin 4. A circuit component 7 such as an IC is mounted on the circuit board 5 through a solder bump 6 or the like and a surface on the mounting side is covered with a coat resin 10. The semiconductor element 3 and the circuit board 5 are electrically connected to each other through a bonding wire 8. FIG. 1A is equivalent to a sectional view in a position P1—P1 of FIG. 1B, and also shows the bonding wire 8 in a portion which does not originally appear for easiness of visual recognition. In FIG. 1B, the sealing resin 9 is shown with portions closer to the semiconductor element 3 and the circuit component 7 than the die pad portion 1A and the board mounting portion 1B omitted.

The lead frame 1 is a plate—shaped member having a radiation function and includes a lead 1a to be exposed from one end side of the sealing resin 9 and to function as an external connecting terminal. The lead 1a is utilized as a ground terminal, for example. At least one lead 15 separated from the lead frame 1 is exposed from the sealing resin 9 on one end side of the sealing resin 9 from which the lead 1a of the lead frame 1 is exposed. The lead 15 is electrically connected to the circuit component 7 through the bonding wire 8, for example.

An anchoring region 1C having the higher anchoring effect for the sealing resin 9 than that of each of the die pad portion 1A and the board mounting portion 1B is provided between the die pad portion 1A and the board mounting portion 1B in the lead frame 1. In the anchoring region 1C according to the first embodiment, one slit 11a is extended as a through hole penetrating through the surface and back of the lead frame 1 in such a direction X as to partition the die pad portion 1A and the board mounting portion 1B (a direction orthogonal to a direction Y from the board mounting portion 1B toward the die pad portion 1A: which appears vertically in FIG. 1B and so are other drawings). The slit 11a can be obtained by carrying out press working on the lead frame 1, for example.

In the semiconductor device, the slit 11a formed between the die pad portion 1A and the board mounting portion 1B in the lead frame 1 causes the sealing resin 9 to communicate from both sides of the lead frame 1. Consequently, the anchoring effect of the sealing resin 9 for the lead frame 1 can be increased and the adhesion of the lead frame 1 to the sealing resin 9 can be enhanced.

Moreover, the die pad portion 1A and the board mounting portion 1B in the lead frame 1 are partitioned by the slit 11a. Therefore, it is possible to prevent the solder 2 and the bonding resin 4 from flowing between the die pad portion 1A and the board mounting portion 1B. As a result, a decrease in a contact area of the lead frame 1 and the sealing resin 9 can be prevented from being caused by the flow of the solder 2 and the bonding resin 4, thereby contributing to an enhancement in the adhesion of the sealing resin 9 to the lead frame 1.

Furthermore, a continuity in the direction Y or an opposite direction thereto over an interface of the lead frame 1 and the sealing resin 9 is interrupted in the slit 11a. Therefore, a stress to be applied from the sealing resin 9 to the die pad portion 1A is relieved. Thus, it is possible to prevent the crack of the semiconductor device 3 and the disconnection of the bonding wire 8 from being caused by the stress.

Second Embodiment

Figure 2A:
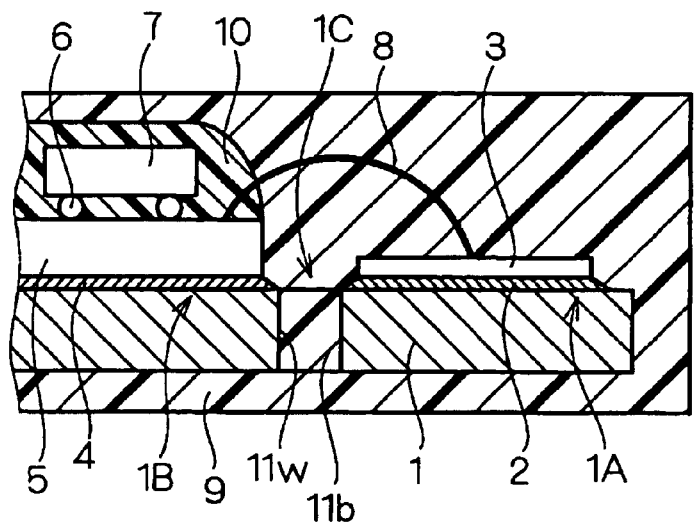
FIGS. 2A and 2B are views showing a schematic structure of a main part of a semiconductor device according to a second embodiment of the present invention.
Figure 2B:
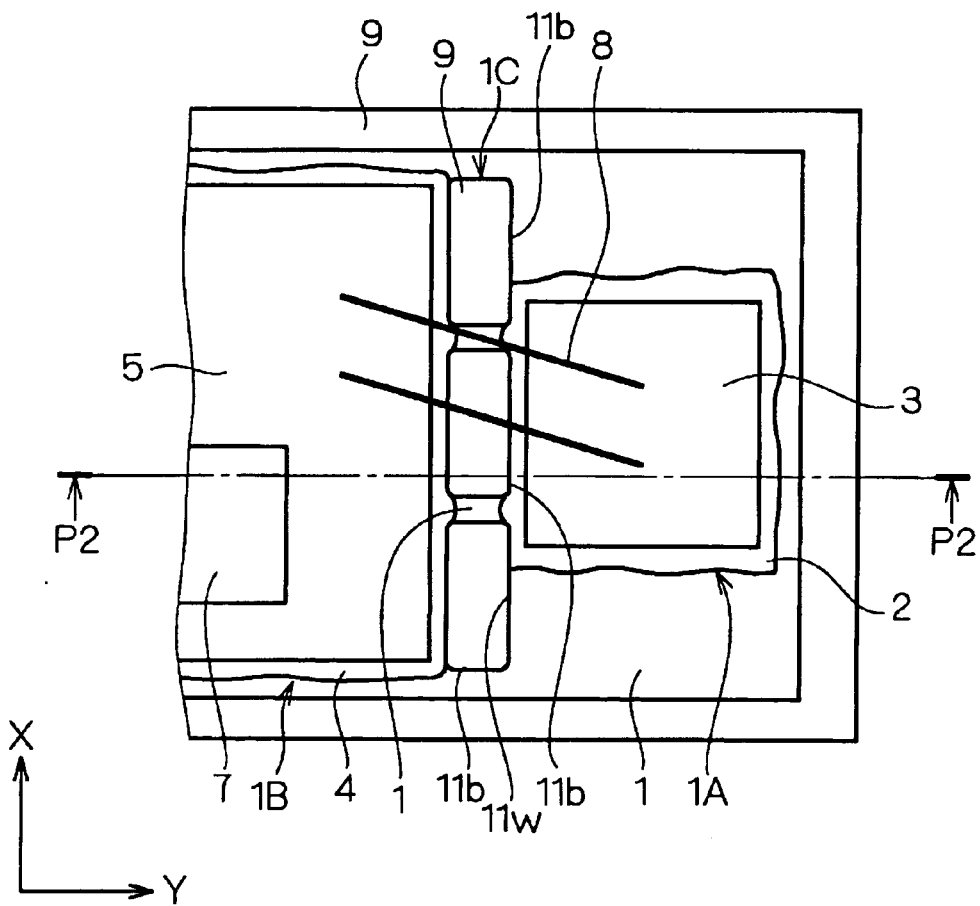

FIGS. 2A and 2B are views showing a schematic structure of a main part of a semiconductor device according to a second embodiment of the present invention and are a longitudinal sectional view and a plan view which show the semiconductor device, respectively. The semiconductor device has a characteristically different structure of an anchoring region 1C from that of the semiconductor device according to the first embodiment. Accordingly, the structure on the left side of a broken line in the drawing appears in the same manner as in FIGS. 1A and 1B and is therefore omitted. FIG. 2A is equivalent to a sectional view in a position P2—P2 of FIG. 2B, and also shows a bonding wire 8 in a portion which does not originally appear for easiness of visual recognition. In FIG. 2B, a sealing resin 9 is shown with portions closer to a semiconductor element 3 and a circuit component 7 than a die pad portion 1A and a board mounting portion 1B omitted.

In the semiconductor device according to the present embodiment, an anchoring region 1C is provided between the die pad portion 1A and the board mounting portion 1B in the lead frame 1. In the anchoring region 1C, a plurality of slits 11b to cause the sealing resin 9 to communicate from both sides of the lead frame 1 are distributed as through holes. The slit 11b has an external shape of a strip seen on a plane and a longitudinal direction thereof is set along a direction X in which the die pad portion 1A and the board mounting portion 1B are partitioned, and the slit 11b is arranged in a line in the direction X. The slit 11b can be obtained by carrying out press working on the lead frame 1, for example. Other structures are the same as those in the first embodiment shown in FIG. 1 and description thereof will be omitted.

Also in the semiconductor device, the slit 11b formed between the die pad portion 1A and the board mounting portion 1B causes the sealing resin 9 to communicate from both sides of the lead frame 1. Consequently, the anchoring effect of the sealing resin 9 for the lead frame 1 can be increased and the adhesion of the lead frame 1 to the sealing resin 9 can be enhanced. Accordingly, the same effects as those in the first embodiment can be obtained.

By providing the slits 11b close to each other, particularly, a total area of side surfaces 11w of the slits 11b can be increased. Accordingly, if the size of a region which can be utilized as the anchoring region 1C is equal, the anchoring effect of the sealing resin 9 can be increased than that in the first embodiment.

Third Embodiment

Figure 3A:
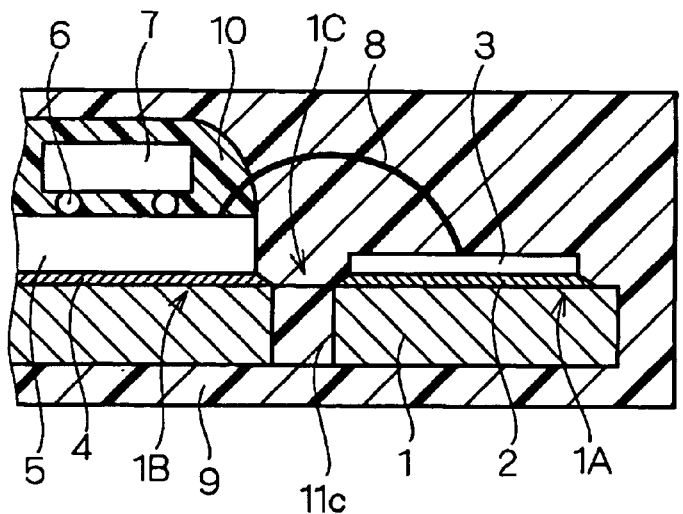
FIGS. 3A and 3B are views showing a schematic structure of a main part of a semiconductor device according to a third embodiment of the present invention.
Figure 3B:
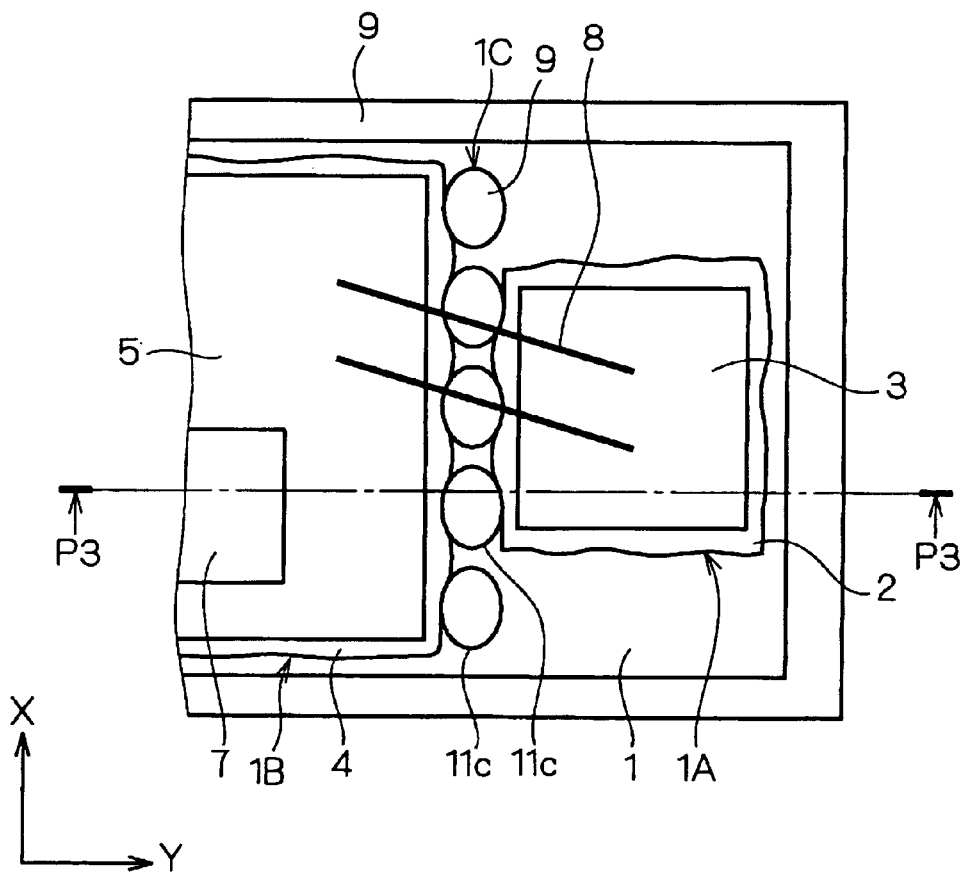

FIGS. 3A and 3B are views showing a schematic structure of a main part of a semiconductor device according to a third embodiment of the present invention and are a longitudinal sectional view and a plan view which show the semiconductor device, respectively. The semiconductor device has a characteristically different structure of an anchoring region 1C from that of the semiconductor device according to the first embodiment. Accordingly, the structure on the left side of a broken line in the drawing appears in the same manner as in FIGS. 1A and 1B and is therefore omitted. FIG. 3A is equivalent to a sectional view in a position P3—P3 of FIG. 3B, and also shows a bonding wire 8 in a portion which does not originally appear for easiness of visual recognition. In FIG. 3B, a sealing resin 9 is shown with portions closer to a semiconductor element 3 and a circuit component 7 than a die pad portion 1A and a board mounting portion 1B omitted.

In the semiconductor device according to the present embodiment, an anchoring region IC is provided between the die pad portion 1A and the board mounting portion 1B in the lead frame 1. In the anchoring region 1C, a plurality of slits 11c to cause the sealing resin 9 to communicate from both sides of the lead frame 1 are distributed as through holes in the same manner as in the second embodiment. The slit 11c has an external shape of an ellipse seen on a plane and a longitudinal direction thereof is set along a direction X in which the die pad portion 1A and the board mounting portion 1B are partitioned, and the slit 11b is arranged in a line in the direction X. Other structures are the same as those in the first embodiment shown in FIG. 1 and description thereof will be omitted.

Also in the semiconductor device, the slit 11c formed between the die pad portion 1A and the board mounting portion 1B causes the sealing resin 9 to communicate from both sides of the lead frame 1 in the same manner as the slit 11b according to the second embodiment. Consequently, the anchoring effect of the sealing resin 9 for the lead frame 1 can be increased and the adhesion of the lead frame 1 to the sealing resin 9 can be enhanced. Accordingly, the same effects as those in the second embodiment can be obtained.

Fourth Embodiment

Figure 4:
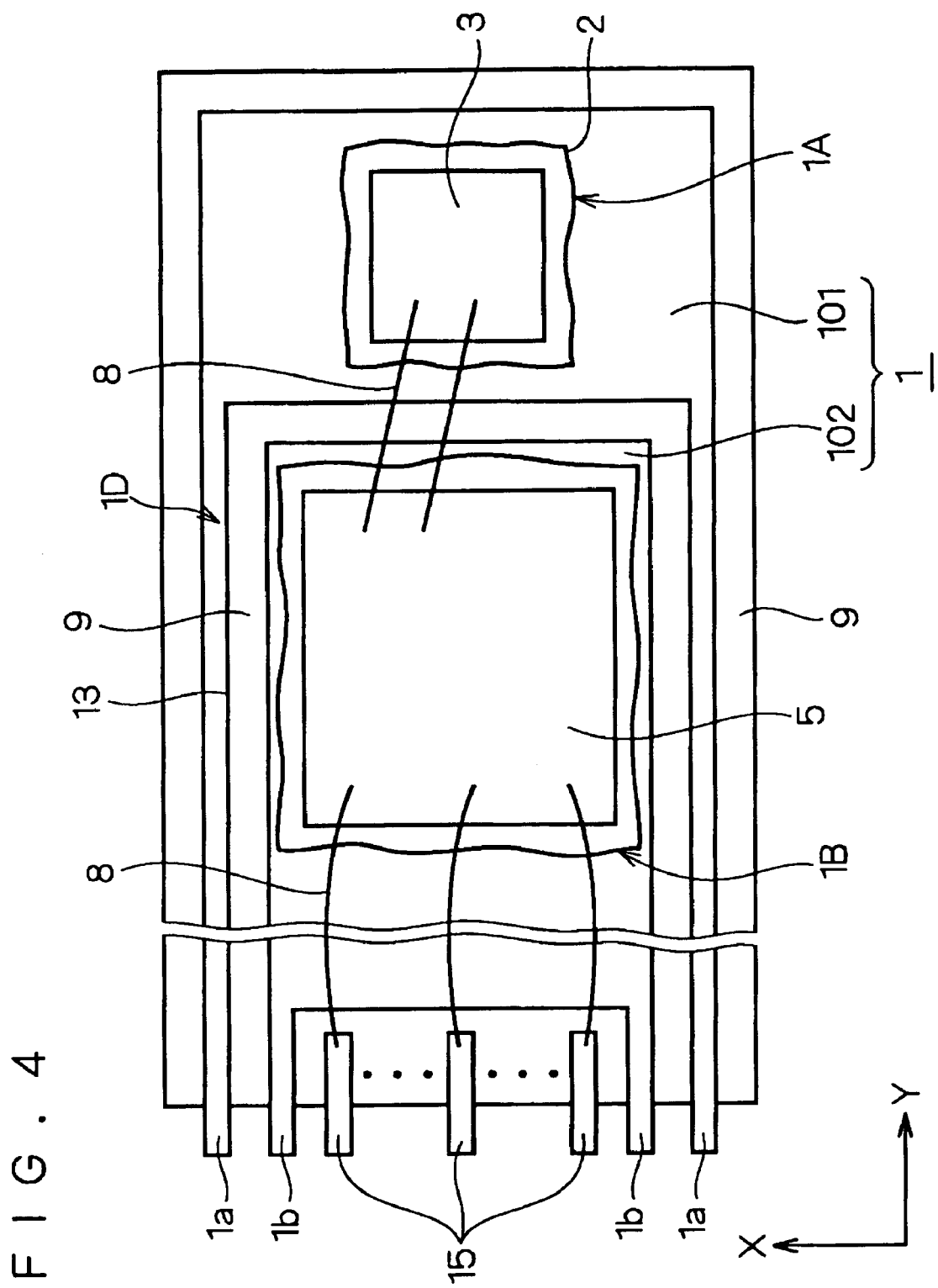
FIG. 4 is a plan view showing a schematic structure of a main part of a semiconductor device according to a fourth embodiment of the present invention, p

FIG. 4 is a plan view showing a schematic structure of a main part of a semiconductor device according to a fourth embodiment of the present invention. In the semiconductor device, a lead frame 1 is divided by a dividing portion 13 into a lead frame portion 102 and a lead frame portion 101 surrounding the lead frame portion 102 in three directions as seen on a plane. The lead frame portion 101 has a die pad portion 1A and the lead frame portion 102 has a board mounting portion 1B. The lead frame portion 101 further has a lead 1a to function as an external connecting terminal and the lead frame portion 102 further has a lead 1b to function as an external connecting terminal. Both of the leads 1a and 1b are provided on opposite side of the die pad portion 1A with respect to the board mounting portion 1B and a part thereof is exposed from a sealing resin 9.

In other words, an anchoring region 1D according to the present embodiment has a U shape seen on a plane which passes through a portion between the die pad portion 1A and the board mounting portion 1B and is extended toward the side where the leads 1a and 1b are provided. In the dividing portion 13 where the anchoring region 1D is formed, the sealing resin 9 communicates from both sides of the lead frame 1. More specifically, the dividing portion 13 can also be grasped as a through hole. Other structures are the same as those in the first embodiment. The sealing resin 9 is shown with portions closer to a semiconductor element 3 and a circuit component 7 than the die pad portion 1A and the board mounting portion 1B omitted.

In the semiconductor device according to the present embodiment, the anchoring region 1D includes the anchoring region 1C according to the first embodiment. Accordingly, the same effects as those in the first embodiment can be obtained. Furthermore, the anchoring region 1D also includes a portion extended in a direction Y(or an opposite direction thereto) from the board mounting portion 1B toward the die pad portion 1A. Therefore, the anchoring effect of the sealing resin 9 can be more increased than that in the first embodiment.

In the present embodiment, the lead frame portions 101 and 102 are divided. Therefore, it is desirable that the leads 1a and 1b should be coupled through a tie bar (not shown) before sealing is carried out by the sealing resin 9. It is desirable that the semiconductor element 3 and a circuit board 5 should be mounted on the lead frame 1 with the tie bar provided, a part of the leads 1a and 1b including the tie bar should not be sealed also during the sealing carried out by the sealing resin 9 and the tie bar should be cut after the sealing is carried out by the sealing resin 9.

Fifth Embodiment

Figure 5:
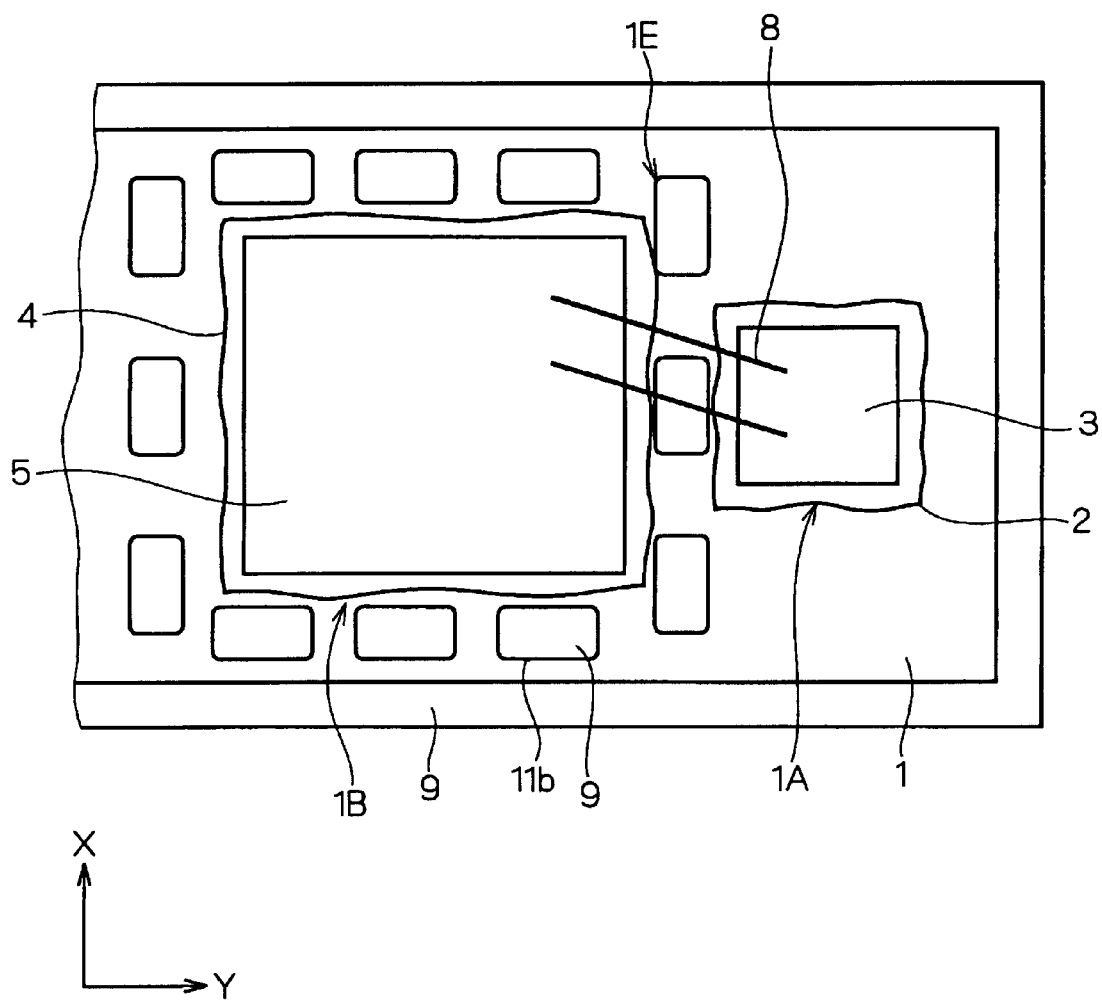
FIG. 5 is a plan view showing a schematic structure of a main part of a semiconductor device according to a fifth embodiment of the present invention.

FIG. 5 is a plan view showing a schematic structure of a main part of a semiconductor device according to a fifth embodiment of the present invention. In the semiconductor device, a plurality of slits 11b are provided around a board mounting portion 1B as well as the portion between the die pad portion 1A and the board mounting portion 1B described in the second embodiment.

In other words, an anchoring region 1E according to the present embodiment is present around the board mounting portion 1B as seen on a plane and a sealing resin 9 communicates from both sides of a lead frame 1 in the slit 11b formed on the anchoring region 1E.

Other structures are the same as those in the first embodiment. The sealing resin 9 is shown with portions closer to a semiconductor element 3 and a circuit component 7 than the die pad portion 1A and the board mounting portion 1B omitted.

In the semiconductor device according to the present embodiment, the anchoring region 1E includes the anchoring region 1C according to the second embodiment. Accordingly, the same effects as those in the second embodiment can be obtained.

The anchoring region 1E also includes a portion extended in a direction Y from the board mounting portion 1B toward the die pad portion 1A. Moreover, the division of the lead frame 1 according to the fourth embodiment is not present. Therefore, it is possible to provide the anchoring region 1E also in a portion on the opposite side of the die pad portion 1A with respect to the board mounting portion 1B. Consequently, the anchoring effect of the sealing resin 9 can be increased.

Sixth Embodiment

Figure 6A:
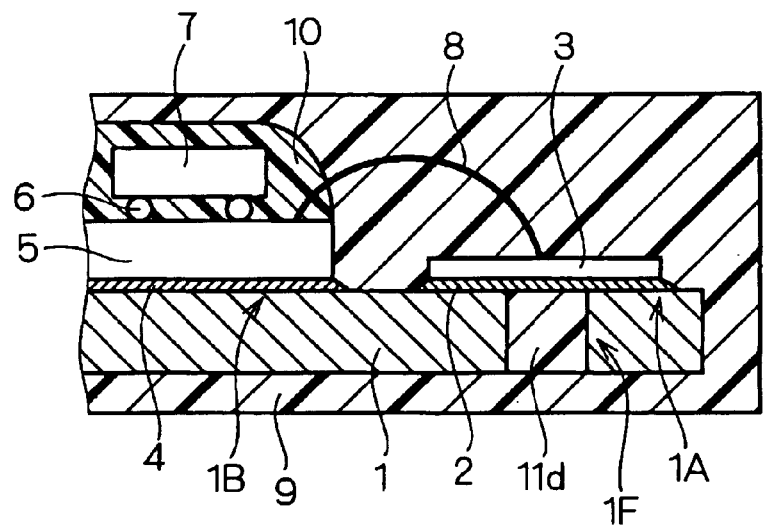
FIGS. 6A and 6B are views showing a schematic structure of a main part of a semiconductor device according to a sixth embodiment of the present invention.
Figure 6B:
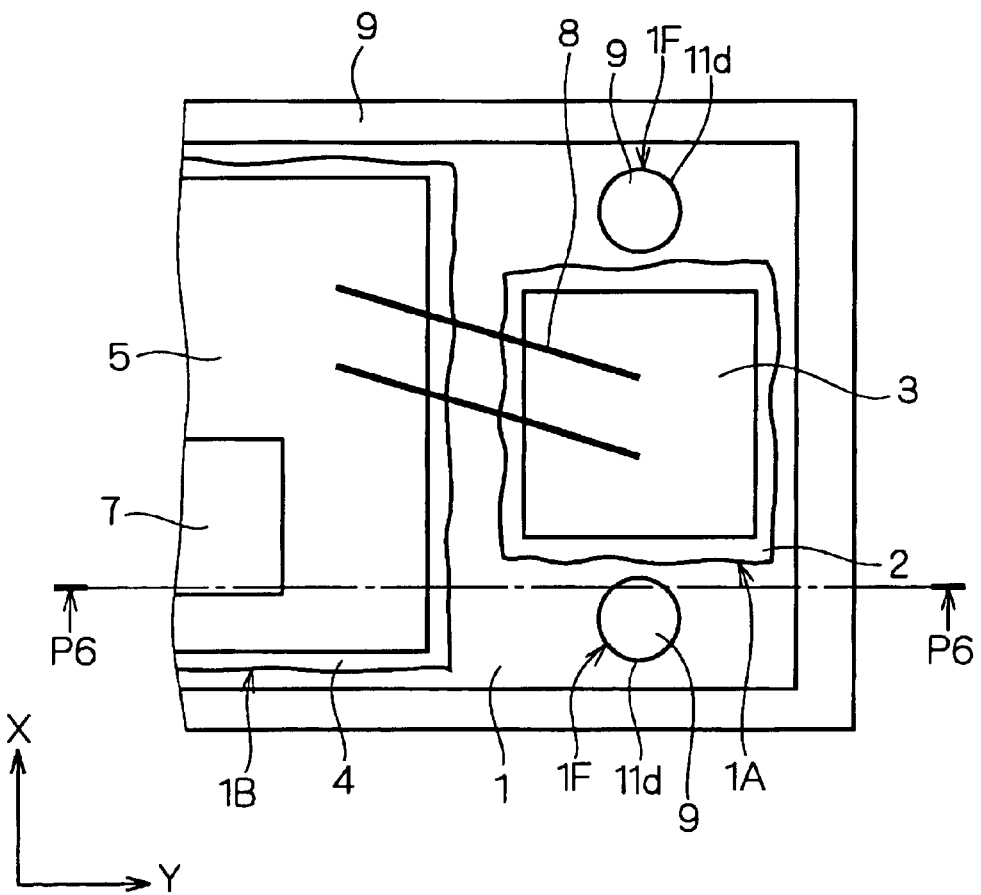

FIGS. 6A and 6B are views showing a schematic structure of a main part of a semiconductor device according to a sixth embodiment of the present invention and are a longitudinal sectional view and a plan view which show the semiconductor device, respectively. The semiconductor device has a characteristically different an anchoring region from that of the semiconductor device according to the first embodiment. Accordingly, a structure on the left side of a broken line in the drawing appears in the same manner as in FIGS. 1A and 1B and is therefore omitted. FIG. 6A is equivalent to a sectional view in a position P6—P6 of FIG. 6B, and also shows a solder 2, a semiconductor element 3 and a bonding wire 8 in a portion which does not originally appear for easiness of visual recognition. In FIG. 6B, a sealing resin 9 is shown with portions closer to the semiconductor element 3 and a circuit component 7 than a die pad portion 1A and a board mounting portion 1B omitted.

In the semiconductor device according to the present embodiment, the sealing resin 9 communicates from both sides of a lead frame 1 in an anchoring region 1F. In the anchoring region 1F, a slit 11d having an external shape of a circle seen on a plane is formed as a through hole. Differently from the first and fifth embodiments, in the sixth embodiment, the anchoring effect for the sealing resin 9 is not greater between the die pad portion 1A and the board mounting portion 1B in the lead frame 1 than that of each of the die pad portion 1A and the board mounting portion 1B.

The slit 11d is provided in the vicinity of both side parts of the die pad portion 1A in such a direction X as to partition the die pad portion 1A and the board mounting portion 1B. The slit 11d is present on the die pad portion 1A side as seen in a direction Y from the board mounting portion 1B toward the die pad portion 1A. Therefore, a continuity of an interface of the lead frame 1 and the sealing resin 9 in a direction from the die pad portion 1A toward the board mounting portion 1B or an opposite direction thereto is interrupted in the slit 11d. In the side part of the die pad portion 1A in such a direction X as to partition the die pad portion 1A and the board mounting portion 1B, consequently, a stress generated by a difference in a coefficient of thermal expansion between components can be relieved. Accordingly, it is possible to prevent the crack of the semiconductor element 3 or the disconnection of the bonding wire 8 from being caused by the stress.

Seventh Embodiment

Figure 7A:
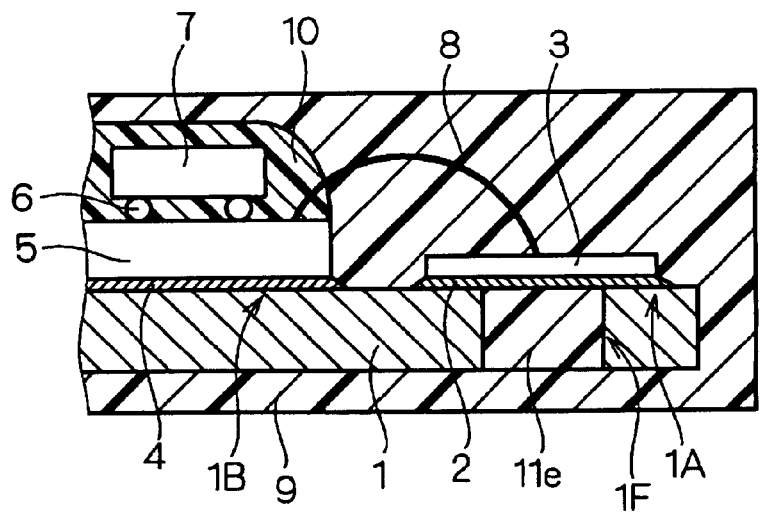
FIGS. 7A and 7B are views showing a schematic structure of a main part of a semiconductor device according to a seventh embodiment of the present invention.
Figure 7B:
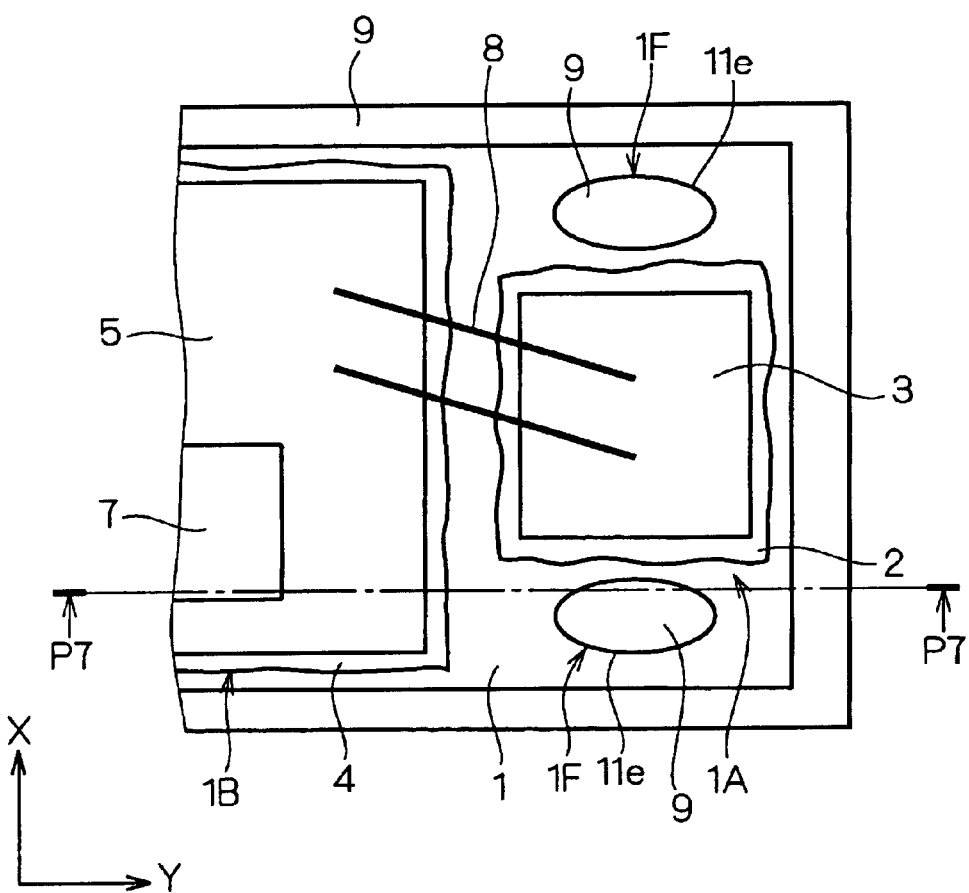

FIGS. 7A and 7B are views showing a schematic structure of a main part of a semiconductor device according to a seventh embodiment of the present invention and are a longitudinal sectional view and a plan view which show the semiconductor device, respectively. The semiconductor device has a characteristically different anchoring region 1F from that of the semiconductor device according to the first embodiment. Accordingly, a structure on the left side of a broken line in the drawing appears in the same manner as in FIGS. 1A and 1B and is therefore omitted. FIG. 7A is equivalent to a sectional view in a position P7—P7 of FIG. 7B, and also shows a solder 2, a semiconductor element 3 and a bonding wire 8 in a portion which does not originally appear for easiness of visual recognition. In FIG. 7B, a sealing resin 9 is shown with portions closer to the semiconductor element 3 and a circuit component 7 than a die pad portion 1A and a board mounting portion 1B omitted.

The semiconductor device has such a structure that the slit 11d of the anchoring region 1F in the sixth embodiment shown in FIG. 6 is replaced with an elliptic slit 11e. A major axis of an ellipse presented by the slit 11e as seen on a plane is parallel with a Y direction from the board mounting portion 1B toward the die pad portion 1A. Other structures are the same as those of the sixth embodiment and description thereof will be omitted.

In the semiconductor device, the slit 11e formed in the vicinity of both sides of the die pad portion 1A in such a direction X as to partition the die pad portion 1A and the board mounting portion 1B presents an ellipse as seen on a plane. A minor axis of the ellipse is parallel with the direction X in which the die pad portion 1A and the board mounting portion 1B are partitioned. Accordingly, the semiconductor device can easily be applied to the case in which a lead frame 1 has no margin in the direction X. The slit 11e may have the shape of a bar extended in the direction X. In addition, a through hole having a larger size in the direction Y than that in the direction X may be formed in the anchoring region 1F.

Eighth Embodiment

Figure 8A:
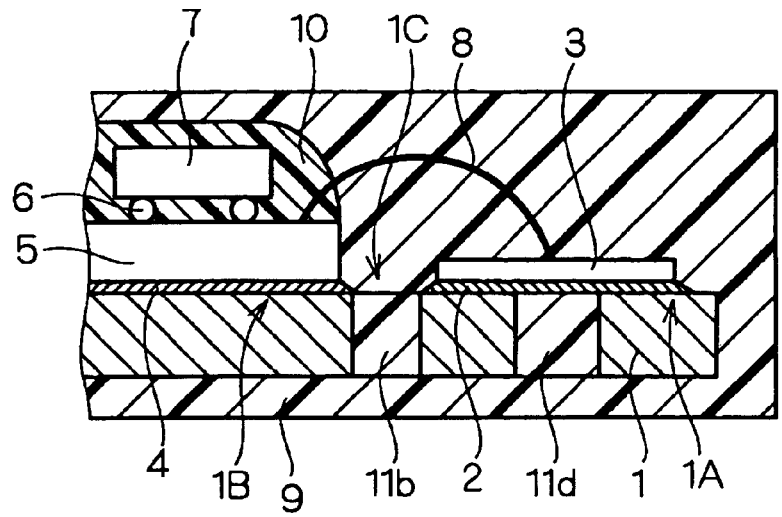
FIGS. 8A and 8B are views showing a schematic structure of a main part of a semiconductor device according to an eighth embodiment of the present invention.
Figure 8B:
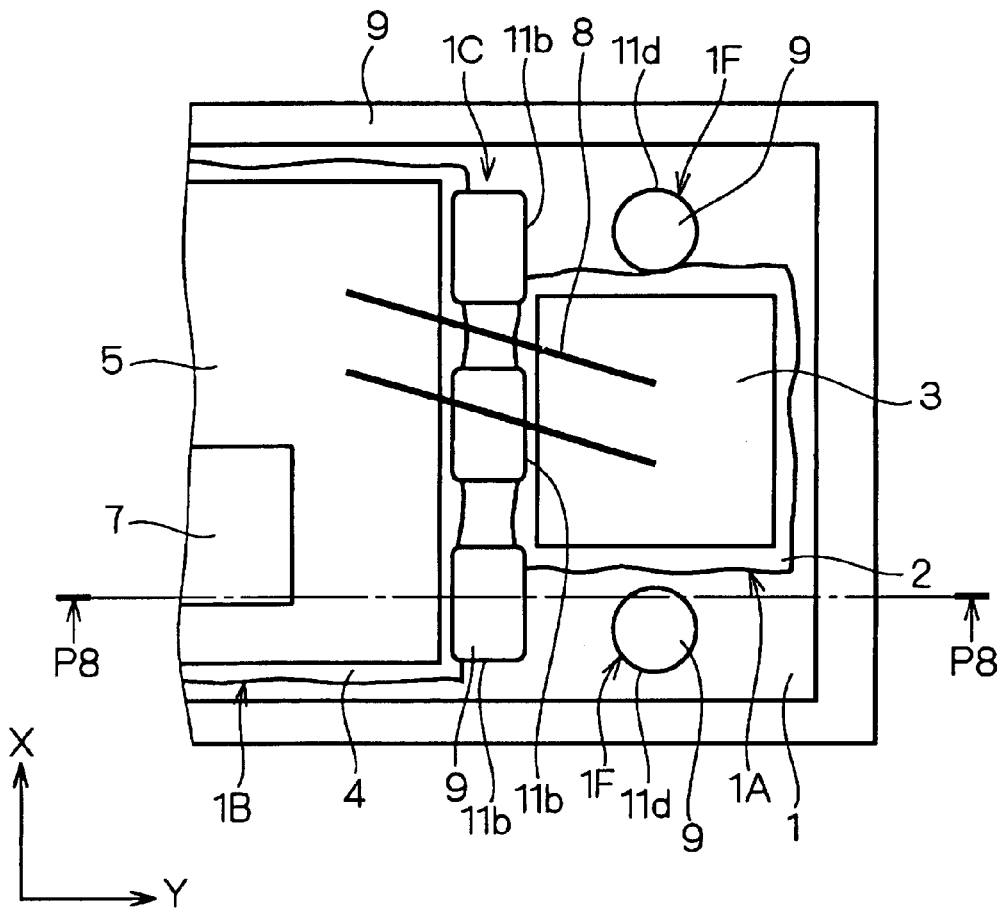

FIGS. 8A and 8B are views showing a schematic structure of a main part of a semiconductor device according to an eighth embodiment of the present invention and are a longitudinal sectional view and a plan view which show the semiconductor device, respectively. The semiconductor device has a characteristically different anchoring region from that of the semiconductor device according to the first embodiment. Accordingly, a structure on the left side of a broken line in the drawing appears in the same manner as in FIGS. 1A and 1B and is therefore omitted. FIG. 8A is equivalent to a sectional view in a position P8—P8 of FIG. 8B, and also shows a solder 2, a semiconductor element 3 and a bonding wire 8 in a portion which does not originally appear for easiness of visual recognition. In FIG. 8B, a sealing resin 9 is shown with portions closer to the semiconductor element 3 and a circuit component 7 than a die pad portion 1A and a board mounting portion 1B omitted.

The semiconductor device has such a structure that the second embodiment shown in FIG. 2 and the sixth embodiment shown in FIG. 6 are combined. More specifically, a plurality of slits 11b to cause the sealing resin 9 to communicate from both sides of a lead frame 1 are distributed between the die pad portion 1A and the board mounting portion 1B in the lead frame 1. Furthermore, a slit 11d is provided in the vicinity of both side parts of the die pad portion 1A in such a direction X as to partition the die pad portion 1A and the board mounting portion 1B.

In the semiconductor device according to the present embodiment, as described above, the adhesion of the sealing resin 9 to the lead frame 1 can be more enhanced and a stress causing the crack of the semiconductor element 3 or the disconnection of the bonding wire 8 can be more relieved than in the second and sixth embodiments.

Ninth Embodiment

Figure 9:
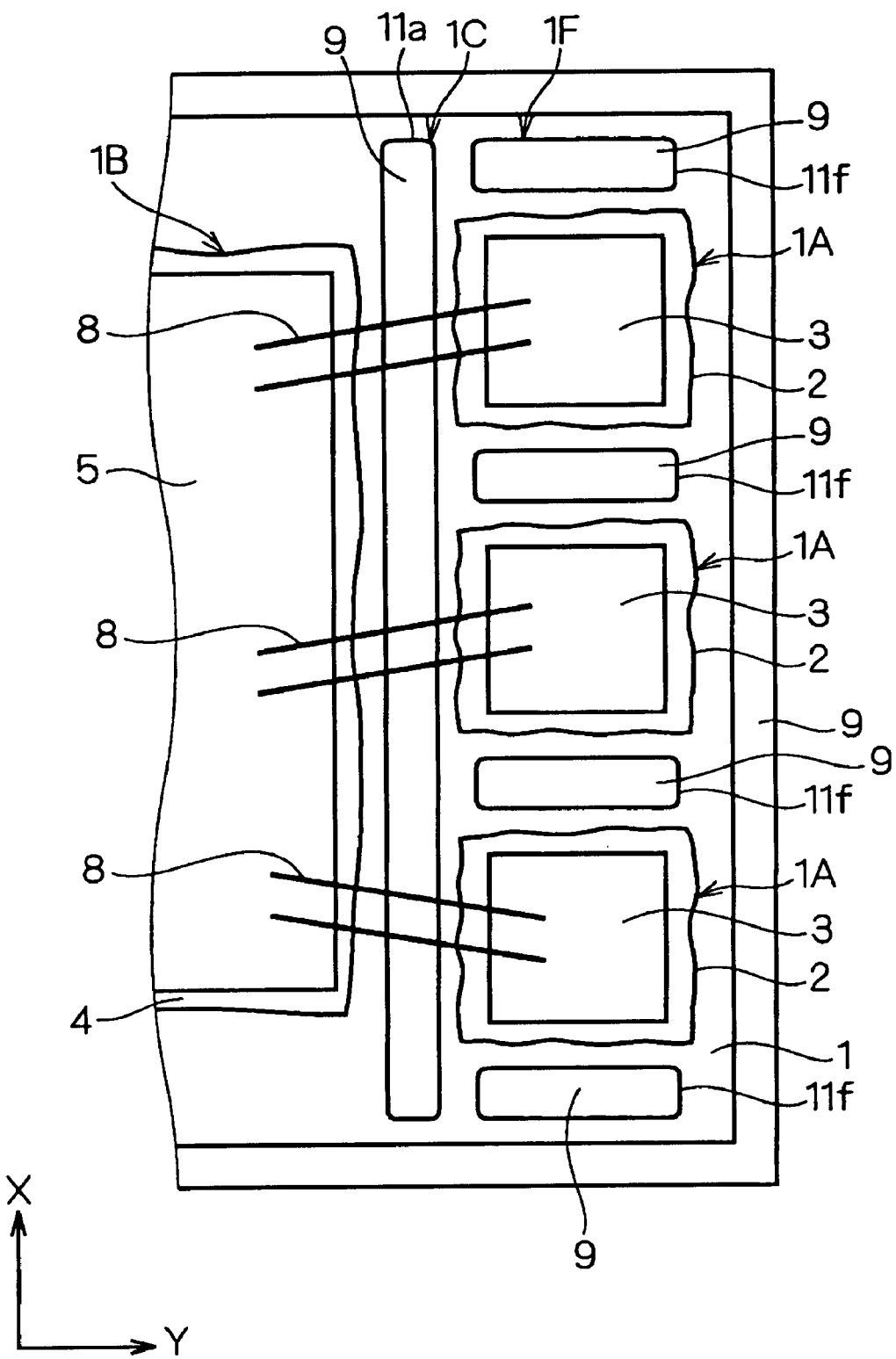
FIG. 9 is a plan view showing a schematic structure of a main part of a semiconductor device according to a ninth embodiment of the present invention.

FIG. 9 is a plan view showing a schematic structure of a main part of a semiconductor device according to a ninth embodiment of the present invention. The semiconductor device is different from the semiconductor device shown in the drawings according to the first to eighth embodiments in that a plurality of die pad portions 1A are arranged on the same side with respect to a board mounting portion 1B in a lead frame 1. A semiconductor element 3 is fixed to a surface of each of the die pad portions 1A through a solder 2. The semiconductor elements 3 of the die pad portions 1A are individually connected electrically to a circuit board 5 through a bonding wire 8. The semiconductor device is characteristically identical to the semiconductor device according to the first embodiment except that a plurality of die pad portions 1A and a plurality of semiconductor elements 3 are provided as described above and an anchoring region is different. Accordingly, portions which are not shown in the drawing, for example, leads 1a and 15 and the like are constituted in the same manner as those in the first embodiment. A sealing resin 9 is shown with portions closer to the semiconductor element 3 and a circuit component 7 than the die pad portion 1A and the board mounting portion 1B omitted.

In the semiconductor device, a slit 11a extended in such a direction X as to partition the die pad portion 1A and the board mounting portion 1B is formed as an anchoring region 1C in the same manner as in the first embodiment. In the same manner as in the seventh embodiment, furthermore, an anchoring region 1F is provided in the vicinity of both side parts of the die pad portion 1A in the direction X on the die pad portion 1A side seen from the board mounting portion 1B in a direction Y from the board mounting portion 1B to the die pad portion 1A. In the present embodiment, a strip-shaped slit 11f having a longitudinal direction set to the direction Y is illustrated as a through hole in the anchoring region 1F.

In the present embodiment described above, the adhesion of the sealing resin 9 to the lead frame 1 can be more enhanced and a stress causing the crack of the semiconductor element 3 or the disconnection of the bonding wire 8 can be more relieved than in the first and seventh embodiments.

Tenth Embodiment

Figure 10A:
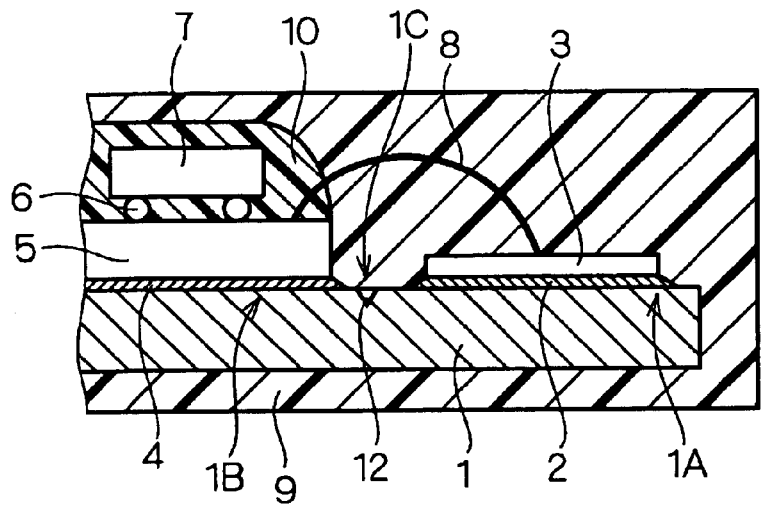
FIGS. 10A and 10B are views showing a schematic structure of a main part of a semiconductor device according to a tenth embodiment of the present invention.
Figure 10B:
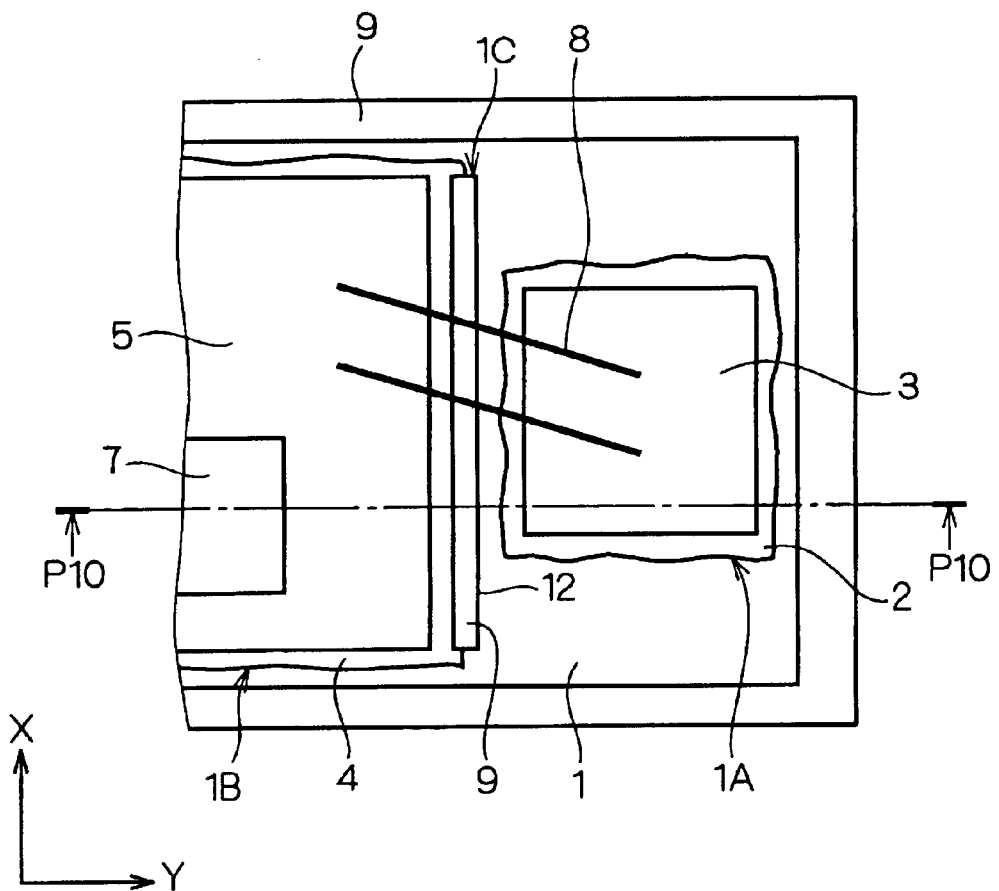

FIGS. 10A and 10B are views showing a schematic structure of a main part of a semiconductor device according to a tenth embodiment of the present invention and are a longitudinal sectional view and a plan view which show the semiconductor device, respectively. The semiconductor device has a characteristically different structure of an anchoring region 1C from that of the semiconductor device according to the first embodiment. Accordingly, the structure on the left side of a broken line in the drawing appears in the same manner as in FIGS. 1A and 1B and is therefore omitted. FIG. 10A is equivalent to a sectional view in a position P10—P10 of FIG. 10B, and also shows a bonding wire 8 in a portion which does not originally appear for easiness of visual recognition. In FIG. 10B, a sealing resin 9 is shown with portions closer to a semiconductor element 3 and a circuit component 7 than a die pad portion 1A and a board mounting portion 1B omitted.

The semiconductor device has such a structure that the slit 11a of the anchoring region 1C in the first embodiment shown in FIG. 1 is replaced with a trench 12 concaved and extended in such a direction X as to partition the die pad portion 1A and the board mounting portion 1B.

While the sealing resin 9 does not communicate with the trench 12 from both sides of a lead frame 1, the sealing resin 9 on the surface side of the lead frame 1 is engaged into the trench 12. Consequently, the anchoring effect of the sealing resin 9 for the lead frame 1 can be obtained and the adhesion of the sealing resin 9 can be enhanced.

In the same manner as the slit 11a, moreover, a continuity of an interface of the lead frame 1 and the sealing resin 9 in a direction Y or an opposite direction thereto is interrupted in the trench 12. Therefore, a stress to be applied from the sealing resin 9 to the die pad portion 1A can be relieved. Consequently, it is possible to prevent the crack of a semiconductor device 3 or the disconnection of the bonding wire 8 from being caused by the stress.

Eleventh Embodiment

Figure 11A:
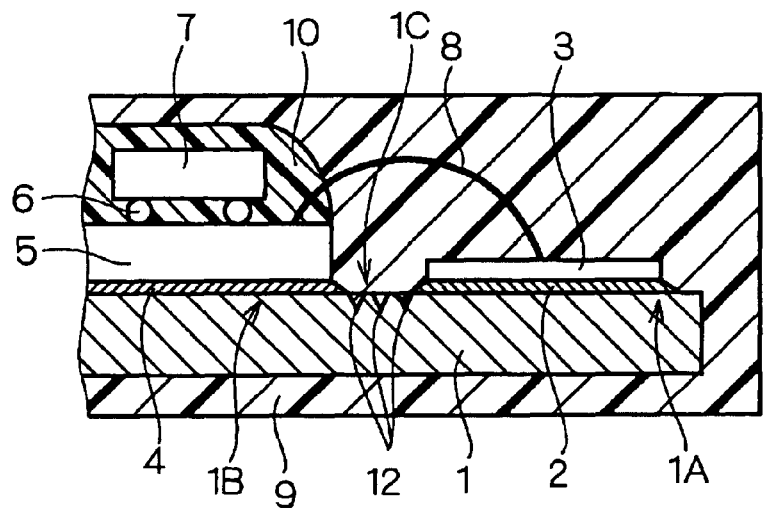
FIGS. 11A and 11B are views showing a schematic structure of a main part of a semiconductor device according to an eleventh embodiment of the present invention.
Figure 11B:
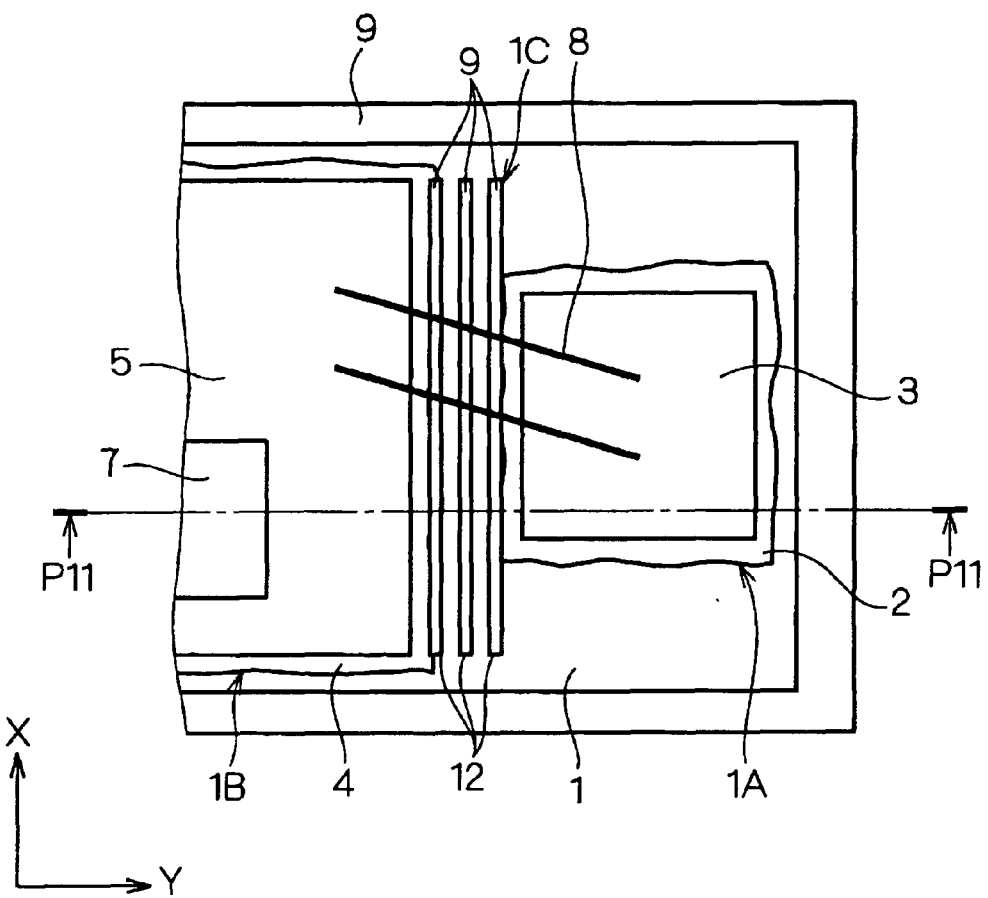

FIGS. 11A and 11B are views showing a schematic structure of a main part of a semiconductor device according to an eleventh embodiment of the present invention and are a longitudinal sectional view and a plan view which show the semiconductor device, respectively. The semiconductor device has a characteristically different structure of an anchoring region 1C from that of the semiconductor device according to the tenth embodiment. Accordingly, the structure on the left side of a broken line in the drawing appears in the same manner as in FIGS. 1A and 1B and is therefore omitted. FIG. 11A is equivalent to a sectional view in a position P11—P11 of FIG. 11B, and also shows a bonding wire 8 in a portion which does not originally appear for easiness of visual recognition. In FIG. 11B, a sealing resin 9 is shown with portions closer to a semiconductor element 3 and a circuit component 7 than a die pad portion 1A and a board mounting portion 1B omitted.

The semiconductor device is characteristically different in that a plurality of trenches 12 according the tenth embodiment are provided in parallel in such a direction X as to partition the die pad portion 1A and the board mounting portion 1B. Since the trenches 12 are provided, the anchoring effect of the sealing resin 9 obtained by the semiconductor device according to the tenth embodiment is great and the adhesion of the sealing resin 9 to a lead frame 1 can be enhanced. Moreover, it is also possible to obtain a great effect that a continuity of an interface of the lead frame 1 and the sealing resin 9 in a direction Y from the board mounting portion 1B to the die pad portion 1A or an opposite direction thereto is interrupted in the direction Y.

Twelfth Embodiment

Figure 12:
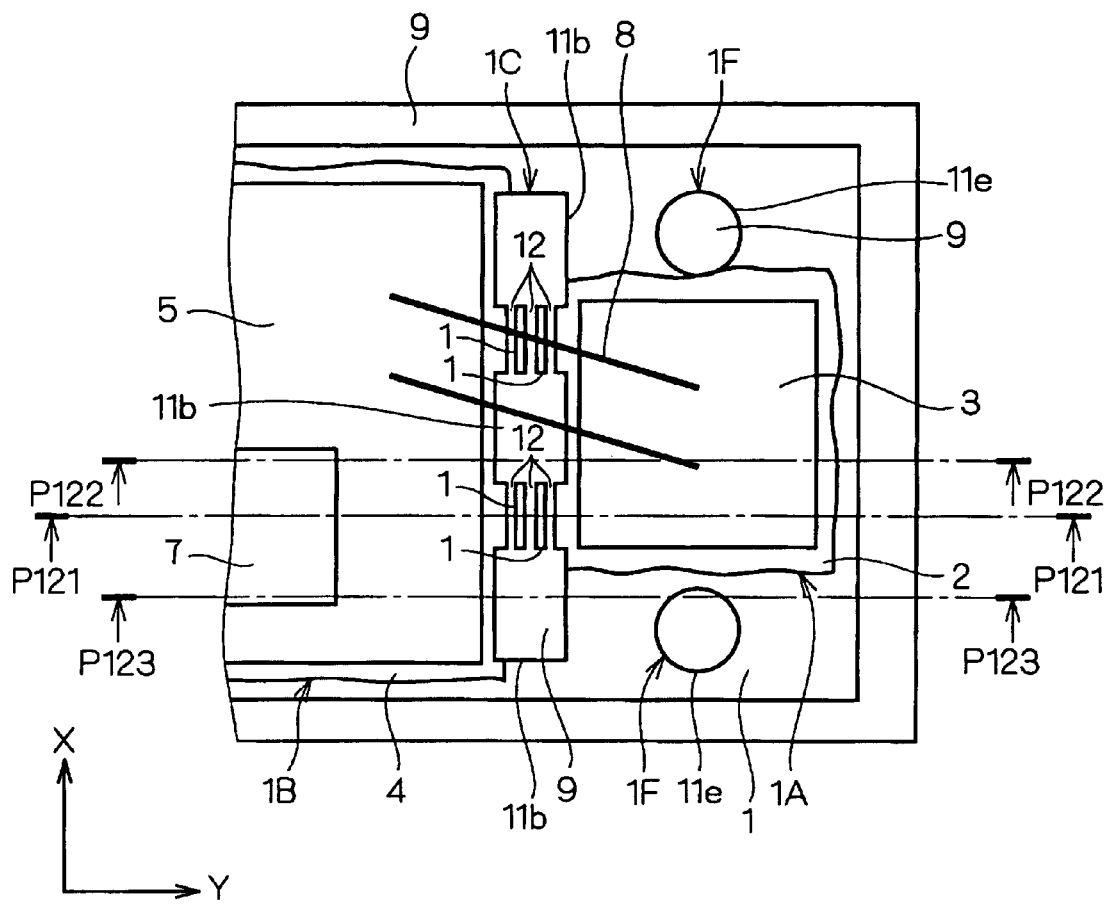
FIG. 12 is a plan view showing a schematic structure of a main part of a semiconductor device according to a twelfth embodiment of the present invention.

FIG. 12 is a plan view showing a schematic structure of a main part of a semiconductor device according to a twelfth embodiment of the present invention. The semiconductor device has such a structure that at least one trench 12 is further provided in a lead frame 1 between the die pad portion 1A and the board mounting portion 1B for the structure according to the eighth embodiment. FIG. 12 illustrates an example in which a plurality of, specifically, three trenches 12 are provided.

Figure 13:
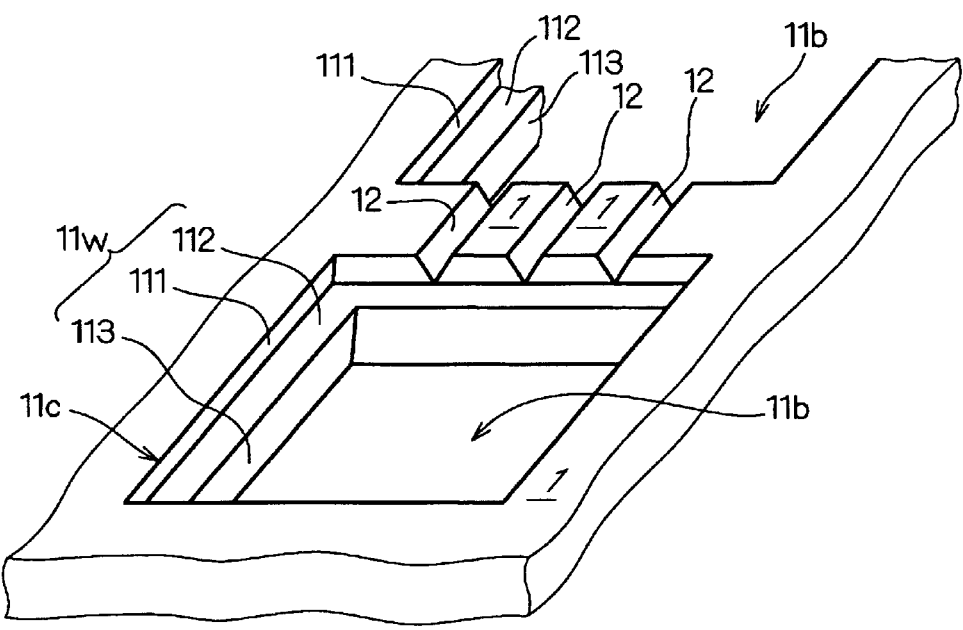
FIG. 13 is a perspective view showing the schematic structure of the main part of the semiconductor device according to the twelfth embodiment of the present invention.

FIG. 13 is a perspective view showing an enlarged vicinity of an anchoring region 1C. In the present embodiment, a side surface 11w of a slit 11b has internal wall surfaces 111 and 113 provided perpendicularly to a surface of the lead frame 1 and an internal wall surface 112 provided in parallel with the surface of the lead frame 1 and serving to connect the internal wall surfaces 111 and 113, which is not shown in detail in FIG. 12. The internal wall surface 111 is provided closer to a semiconductor element 3 than the internal wall surface 113 and more greatly opens the lead frame 1 than the internal wall surface 113. As a matter of course, the side surface 11w of the slit 11b may present only an internal wall surface perpendicular to the surface of the lead frame 1 as shown in FIGS. 2A and 2B. It is preferable that the side surface 11w should have the internal wall surfaces 111, 112 and 113 to increase a contact area of the lead frame 1 and a sealing resin 9, thereby enhancing an anchoring effect. Moreover, a concave portion of the trench 12 may remain in a position of the internal wall surface 112 as shown in FIG. 13 or may deeply reach the opposite side of the semiconductor element 3. Alternatively, the concave portion does not need to reach the position of the internal wall surface 112.

Figure 14:
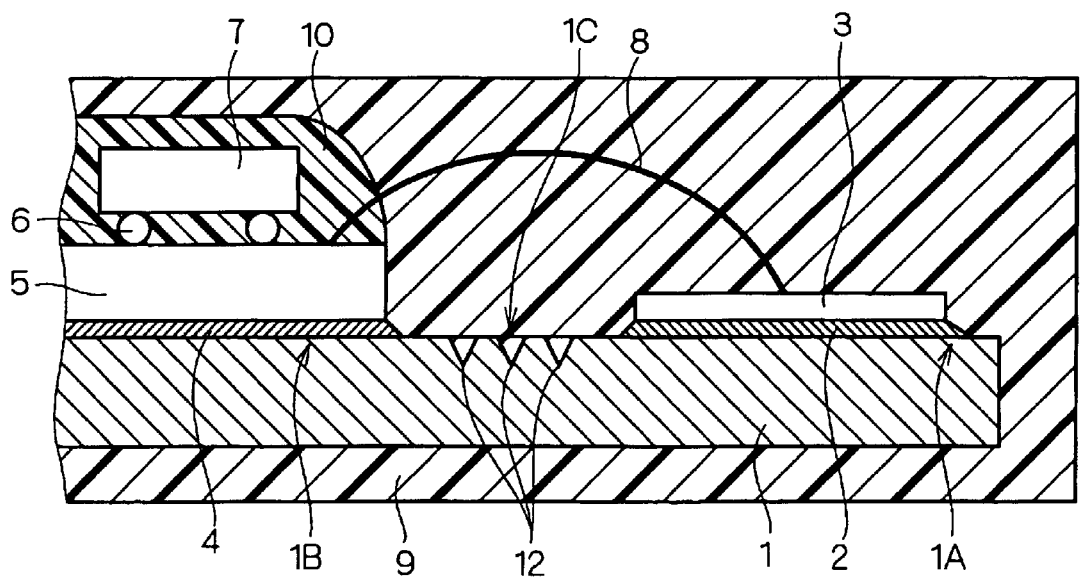
FIGS. 14 to 16 are sectional views showing the schematic structure of the main part of the semiconductor device according to the twelfth embodiment of the present invention.
Figure 15:
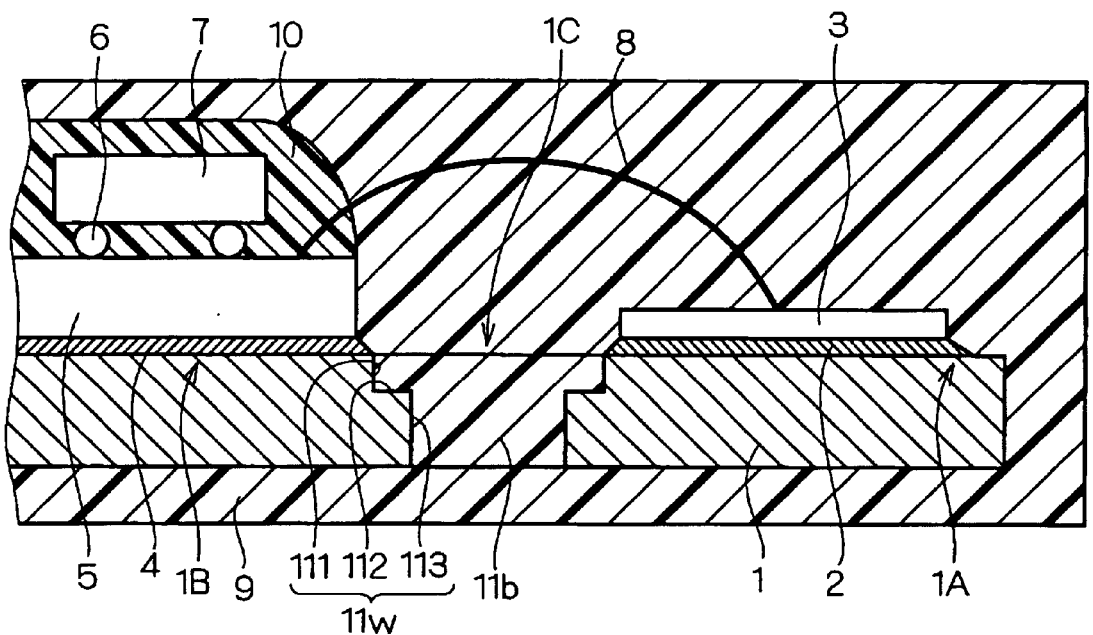
Figure 16:
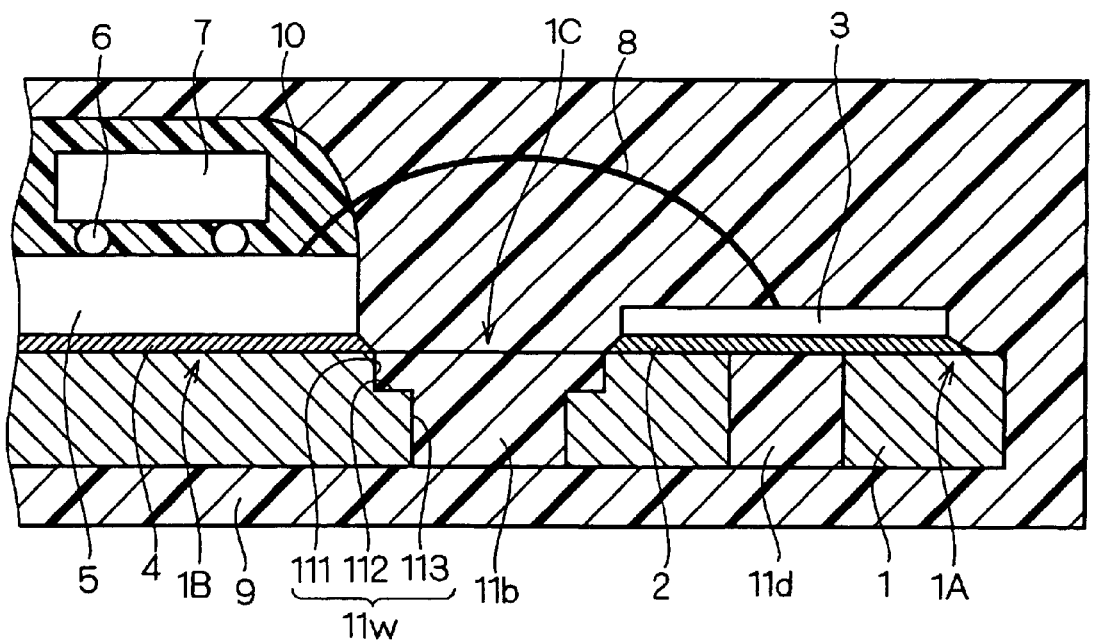
Figure 18A:
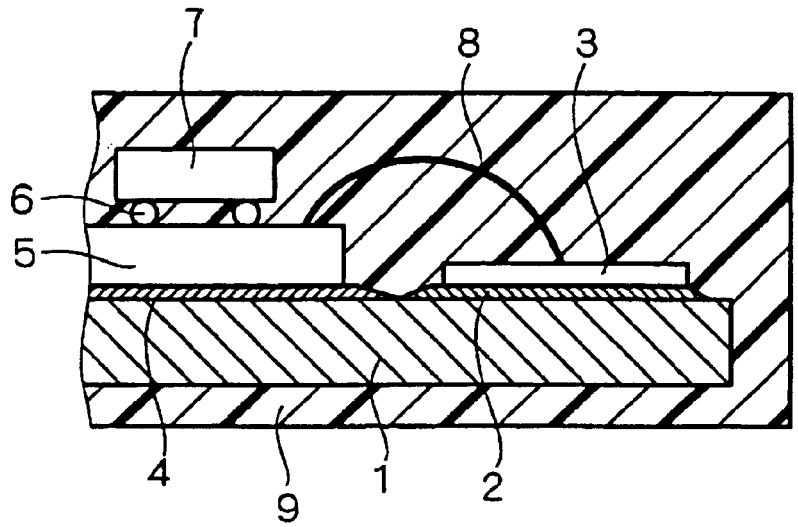
FIGS. 18A and 18B and FIGS. 19A and 19B are views showing a schematic structure of a main part of a conventional semiconductor device.
Figure 18B:
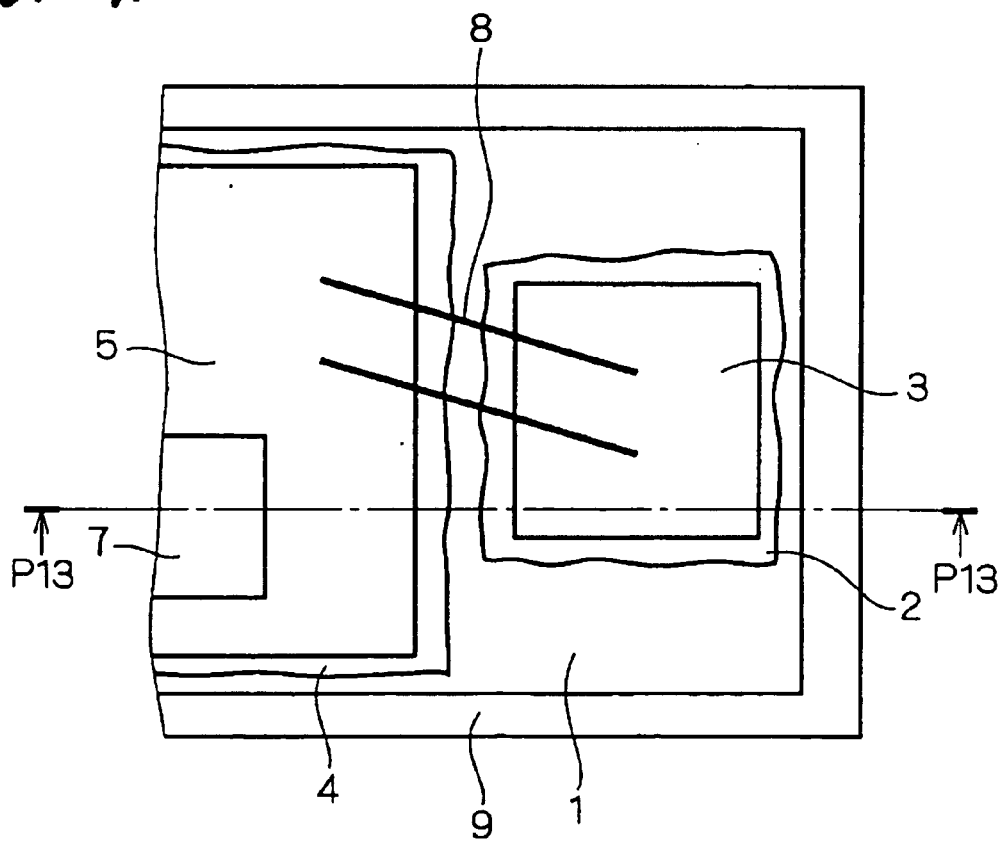
Figure 19A:
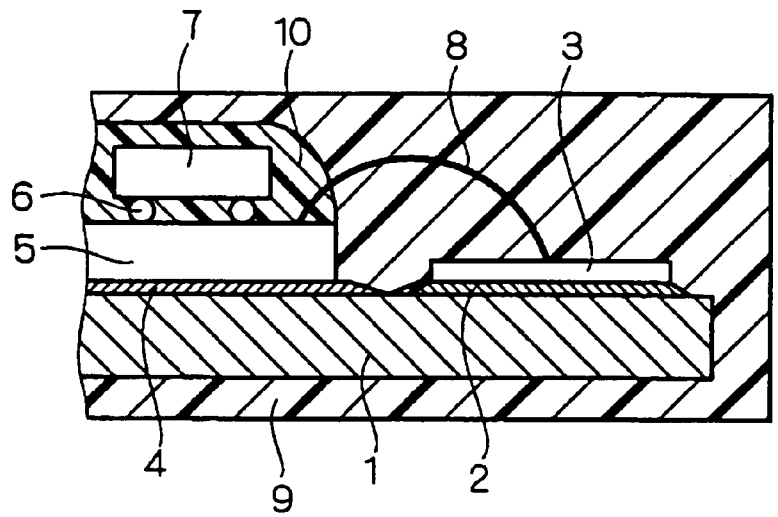
Figure 19B:
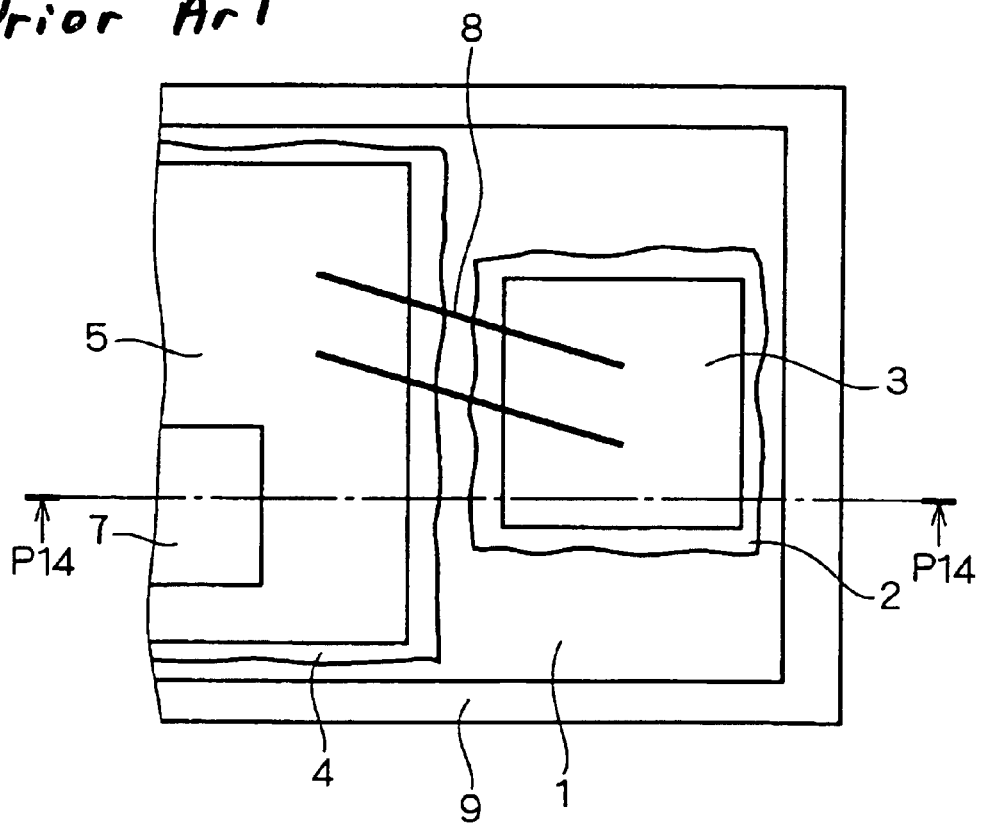

FIGS. 14, 15 and 16 are sectional views in positions P121—P121, P122—P122 and P123—P123 in FIG. 12, respectively. In FIG. 12, the sealing resin 9 is shown with portions closer to the semiconductor element 3 and a circuit component 7 than a die pad portion 1A and a board mounting portion 1B omitted. FIG. 16 also shows a solder 2, the semiconductor device 3 and a bonding wire 8 in a portion which does not originally appear for easiness of visual recognition.

In the semiconductor device according to the present embodiment, as described above, the adhesion of the sealing resin 9 to the lead frame 1 can be more enhanced and a stress causing the crack of the semiconductor element 3 or the disconnection of the bonding wire 8 can be more relieved than in both of the eighth and tenth embodiments or both of the eighth and eleventh embodiments.

FIG. 17 is a perspective view showing a variant of the present embodiment, illustrating the vicinity of the anchoring region 1C. As shown in FIG. 17, an end of the slit 11b may be rounded.

The same structure as that of the side surface 11w provided with the internal wall surfaces 111, 112 and 113 in the slit 11b can be employed for the side surfaces of the slits 11c, 11d and 11e and the dividing portion 13 to enhance the anchoring effect in all the embodiments.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a lead frame including a die pad portion for mounting a semiconductor element thereon, a board mounting portion for mounting a circuit board thereon, and an anchoring region between at least said die pad portion and said board mounting portion; and
    a resin for sealing said semiconductor element, said circuit board, said die pad portion, said anchoring region, and said board mounting portion,
    wherein said anchoring region has a higher anchoring effect for said resin than that of each of said die pad portion and said board mounting portion and includes at least one through hole penetrating through a surface and a back in said lead frame between said die pad portion and said board mounting portion.

2. The semiconductor device according to claim 1, wherein a side surface of said through hole has first and second internal wall surfaces which are perpendicular to said surface of said lead frame and a third internal wall surface which is provided in parallel with said surface of said lead frame and serves to connect said first and second internal wall surfaces.

3. The semiconductor device according to claim 1, wherein a plurality of through holes are provided.

4. The semiconductor device according to claim 3, wherein a side surface of said through hole has first and second internal wall surfaces which are perpendicular to said surface of said lead frame and a third internal wall surface which is provided in parallel with said surface of said lead frame and serves to connect said first and second internal wall surfaces.

5. The semiconductor device according to claim 3, wherein said through hole is provided around said board mounting portion.

6. The semiconductor device according to claim 5, wherein a side surface of said through hole has first and second internal wall surfaces which are perpendicular to said surface of said lead frame and a third internal wall surface which is provided in parallel with said surface of said lead frame and serves to connect said first and second internal wall surfaces.

7. The semiconductor device according to claim 1, wherein said lead frame is divided by a dividing portion into a first lead frame portion having said die pad portion and a second lead frame portion having said board mounting portion, and
    said dividing portion functions as said anchoring region.

8. The semiconductor device according to claim 7, wherein said first lead frame portion surrounds said second lead frame portion in three directions as seen on a plane.

9. The semiconductor device according to claim 7, wherein a side surface of said dividing portion has first and second internal wall surfaces which are perpendicular to said surface of said lead frame and a third internal wall surface which is provided in parallel with said surface of said lead frame and serves to connect said first and second internal wall surfaces.

10. The semiconductor device according to claim 1, wherein said anchoring region is also present in the vicinity of a side part of said die pad portion in such a direction as to partition said die pad portion and said board mounting portion.

11. The semiconductor device according to claim 10, wherein said anchoring region has a plurality of through holes penetrating through a surface and a back in said lead frame.

12. The semiconductor device according to claim 11, wherein a side surface of said through hole has first and second internal wall surfaces which are perpendicular to said surface of said lead frame and a third internal wall surface which is provided in parallel with said surface of said lead frame and serves to connect said first and second internal wall surfaces.

13. A semiconductor device comprising:
    a lead frame including a die pad portion for mounting a semiconductor element thereon, a board mounting portion for mounting a circuit board thereon, and an anchoring region between at least said die pad portion and said board mounting portion; and
    a resin for sealing said semiconductor element, said circuit board, said die pad portion, said anchoring region, and said board mounting portion,
    wherein said anchoring region has a higher anchoring effect for said resin than that of each of said die pad portion and said board mounting portion and includes at least one trench concaved in said lead frame between said die pad portion and said board mounting portion in said lead frame.

14. The semiconductor device according to claim 13, wherein a plurality of trenches are provided.

15. The semiconductor device according to claim 13, wherein said anchoring region is also present in the vicinity of a side part of said die pad portion in such a direction as to partition said die pad portion and said board mounting portion.

16. The semiconductor device according to claim 13, wherein said anchoring region has at least one through hole penetrating through a surface and a back in said lead frame.

17. The semiconductor device according to claim 16, wherein a side surface of said through hole has first and second internal wall surfaces which are perpendicular to said surface of said lead frame and a third internal wall surface which is provided in parallel with said surface of said lead frame and serves to connect said first and second internal wall surfaces.

* * * * *